United States Patent [19]

Miura

[11] Patent Number: 4,688,264
[45] Date of Patent: Aug. 18, 1987

[54] AM/FM RECEIVER WITH AUTOMATIC TUNING SYSTEM

[75] Inventor: Masami Miura, Tokyo, Japan

[73] Assignee: NEC Corporation, Japan

[21] Appl. No.: 780,161

[22] Filed: Sep. 25, 1985

[30] Foreign Application Priority Data

Sep. 26, 1984 [JP] Japan ............................ 59-200904

[51] Int. Cl.[4] .............................................. H03J 7/18
[52] U.S. Cl. .................................. 455/168; 455/134; 455/144; 455/141; 455/188
[58] Field of Search ................ 455/133, 134, 140–144, 455/161, 164, 165, 168, 180, 188, 194

[56] References Cited

U.S. PATENT DOCUMENTS

| | | | |
|---|---|---|---|
| 3,665,507 | 5/1972 | Peil | 455/144 |
| 3,803,494 | 4/1974 | Howell et al. | 455/180 |
| 3,976,943 | 8/1976 | Cipher et al. | 455/144 |
| 4,222,121 | 9/1980 | Matsumoto et al. | 455/168 |
| 4,495,650 | 1/1985 | Konishi et al. | 455/168 |
| 4,527,281 | 7/1985 | Imagawa et al. | 455/168 |

Primary Examiner—Jin F. Ng
Attorney, Agent, or Firm—Laff, Whitesel, Conte & Saret

[57] ABSTRACT

An AM/FM receiver provided with an automatic tuning system is disclosed. The receiver includes an AM receiving section having an AM intermediate frequency stage, an FM receiving section having an FM intermediate frequency stage, a selection circuit selecting either one of signals derived from the AM and FM intermediate frequency stages, and a counter counting the frequency of the signal selected by the selection circuit. As a result, the presence of a broadcasting station for the automatic tuning operation is detected by the count value of the counter.

9 Claims, 3 Drawing Figures

AM/FM RECEIVER WITH AUTOMATIC TUNING SYSTEM

BACKGROUND OF THE INVENTION

The present invention relates to an AM/FM receiver, and particularly to an automatic tuning system used in an AM/FM receiver of a digital tuning type.

In recent years, an AM/FM receiver has been equipped with an automatic tuning system to receive automatically AM and FM broadcasting stations. Such an automatic tuning system comprises a frequency scanning section for scanning received frequencies, a station detector section for detecting whether or not an AM or FM broadcasting station is present at the received frequency, and a scanning stop section for stopping the operation of the frequency scanning section in response to a detection signal from the station detector section. As a result, the AM/FM receiver is tuned to a present AM or FM broadcasting station without turning a tuning knob provided on the AM/FM receiver set.

In prior art, the station detector section has been composed of an amplifier having a very narrow band-pass characteristic, a rectifier, and a level comparator. The amplifier responds only to a signal having a predetermined intermediate frequency by its very narrow band-pass characteristic and amplifies the signal. The rectifier rectifies the signal produced by the amplifier to convert it into a D.C. level. The D.C. level is compared with a reference level by the level. comparator, so that the comparator produces the detection signal for stopping the frequency scanning operation when the D.C. level exceeds the reference level Accordingly, the scanning operation of the frequency scanning section is stopped only when an AM or FM broadcasting station is received with a desired electrical field strength, and the AM/FM receiver is turned to the AM or FM broadcasting station.

However, in order to realize a desired band-pass characteristic in the amplifier, a plurality of circuit elements which cannot be formed in an integrated circuit device are required. In other words, the station detector section according to the prior art is not suitable for an integrated circuit device. Moreover, the band-pass characteristic of the amplifier fluctuates from a desired value due to the change in temperature and/or the deviation of the respective circuit elements. For this reason, it often occurs that the station detector section does not detect the presence of AM and/or FM broadcasting stations.

SUMMARY OF THE INVENTION

It is, therefore, an object of the present invention to provide an AM/FM receiver provided with an improved automatic tuning system.

It is another object of the present invention to provide a novel station detector section for an automatic tuning system.

It is still another object of the present invention to provide a switching circuit for an AM/FM receiver of a digital tuning type.

An AM/FM receiver according to the present invention comprises an AM receiver section including an AM local oscillator and an AM intermediate frequency amplifier, an FM receiver section including an FM local oscillator and an FM intermediate frequency amplifier, means responsive to a receiving mode for changing an oscillation frequency of the AM or FM local oscillator, means responsive to the receiving mode for selecting one of signals derived from the AM and FM intermediate frequency amplifiers, means for counting a frequency of the signal selected by the selecting means, means responsive to a count value of the counting means for detecting that the frequency of the selected signal is within a predetermined range to produce a detection signal, and means responsive to the detection signal for stopping the change of the oscillation frequency of the AM or FM local oscillator.

Thus, the AM/FM receiver according to the present invention includes the counting means for counting a carrier frequency of the AM or FM intermediate frequency signal, whereby it is detected whether or not an AM or FM broadcasting station is present at the received frequency. Accordingly, an amplifier having a very narrow band-pass characteristic is not required, which has been employed in the prior art for detecting the presence of the broadcasting stations.

Moreover, one of the AM or FM intermediate frequency signal is selected in response to the receiving mode, and therefore the counting means is used in common for detecting AM and FM broadcasting stations.

It is favorable that the selecting means carries out its selecting operation when the broadcasting station is received with an electrical field strength above a predetermined value. As a result, the receiver is tuned to a present AM or FM broadcasting station with a small noise.

It is convenient that the PLL (Phase Locked Loop) technology is used for changing the oscillation frequency of the local oscillator.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1:
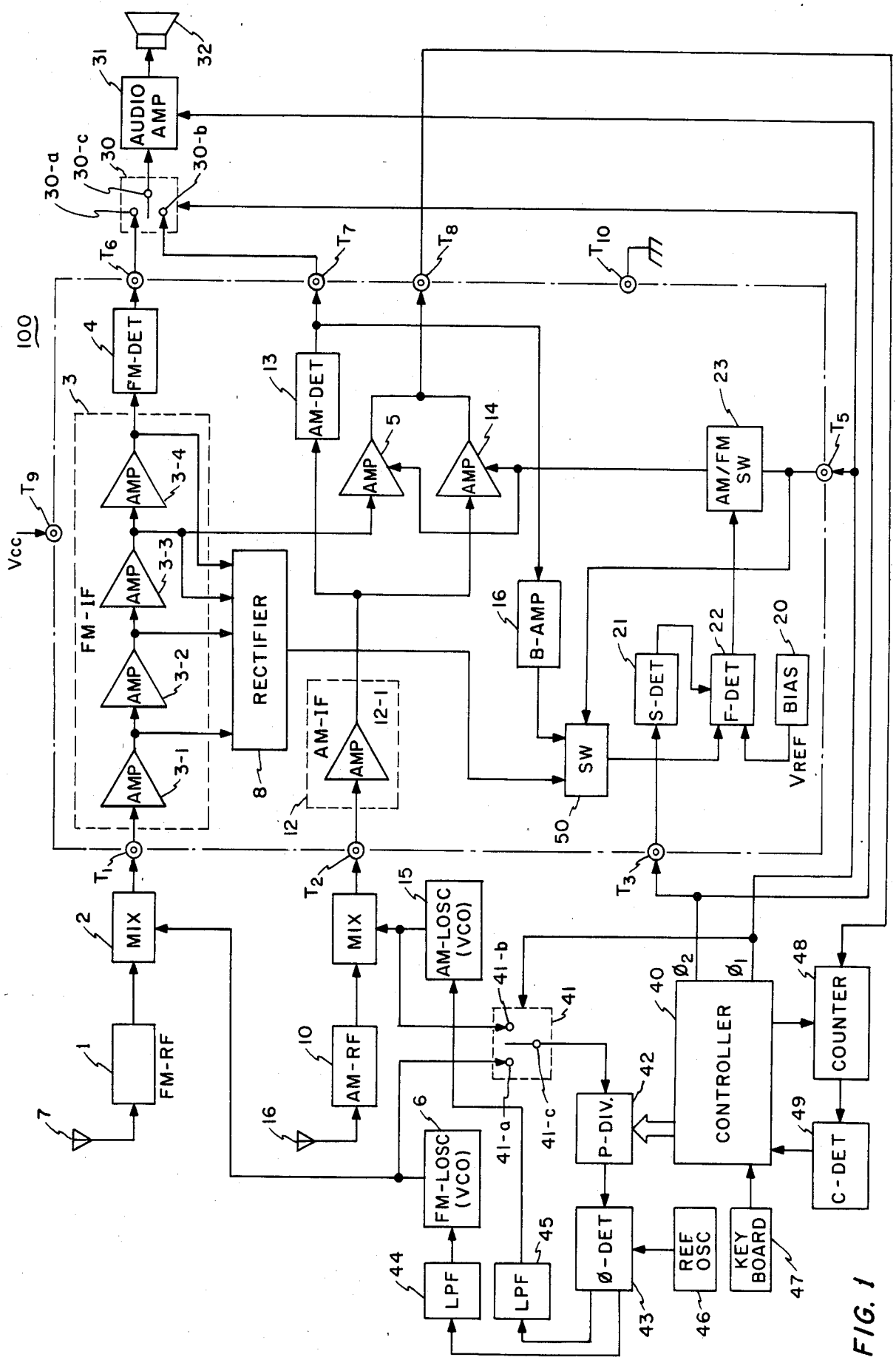
FIG. 1 is a block diagram showing an AM/FM receiver according to an embodiment of the present invention.

Referring to FIG. 1, there is shown a block diagram of an AM/FM receiver according to an embodiment of the present invention. This AM/FM receiver is of a digital tuning type, in which the oscillation frequency of an FM local oscillator 6 and an AM local oscillator 15 are controlled by the so-called PLL (Phase Locked Loop) technology. In an FM receiving mode, a controller 40 changes a mode switching signal $\phi_1$ to a high level, so that contacts 41-$a$ and 41-$c$ of a switch circuit 41 are connected to each other. The controller 40 further supplied a desired frequency division data to a programmable divider 42. The oscillation frequency of the FM local oscillator 6 is thereby divided by the divider 42. The signal via the divider 42 is compared in phase with a reference signal from a reference oscillator 46 by a phase detector 43, and the output of the phase detector 43 is supplied through a low-pass filter 44 to the FM local oscillator 6 as a frequency control signal. The oscillator 6 is a voltage controlled oscillator, and therefore its oscillation frequency is controlled such that the phases of the output signals from the divider 42 and the reference oscillator 46 are equal to each other.

In an AM receiving mode, the mode switching signal $\phi_1$ is changed to a low level, so that the contact 41-c is switched to a second contact 41-b. The AM local oscillator 15 is thereby controlled by the phase detector 43 through a low-pass filter 45.

An FM RF (radio frequency) signal is catched by an FM antenna 7 and amplified by an FM radio frequency section 1. The amplied radio frequency signal is mixed with the local oscillation signal from the oscillator 6 in a mixer circuit 2 to produce an FM IF (intermediate frequency) signal. The FM IF signal is supplied to a terminal $T_1$ of an integrated circuit device (IC) 100.

In the AM receiving mode, an AM RF signal is introduced through an AM antenna 16 to an AM RF section 10, so that an AM IF signal is produced by a mixer 11. The AM IF signal is supplied to a terminal $T_2$ of the IC 100.

The IC 100 includes an FM IF section 3 composed of four IF amplifiers 3-1 to 3-4 and an AM IF section 12 composed of a IF amplifier 12-1. The FM IF section 3 amplies the FM IF signal supplied to the terminal $T_1$ and applies the amplied IF signal to an FM detector 4. The detector 4 reproduces an audio frequency signal which has been frequency-modulated.

The AM IF section 12 amplifies the AM IF signal, and an AM detector 13 reproduces an audio frequency signal which has been amplitude-modulated.

In the FM receiving mode, the mode switching signal $\phi_1$ takes the high level, and hence a switch contact 30-c of a switch circuit 30 is connected to a first contact 30-a which is in turn connected to an FM output terminal $T_6$. Accordingly, an audio amplifier 31 amplifies the audio signal produced from the FM detector 4 and drives a loudspeaker 32. The switch contact 30-c is switched over from the first contact 30-a to a second contact 30-b which is connected to an AM output terminal $T_6$, in AM mode. The audio amplifier 31 thus amplifies the signal from the AM detector 13.

The AM/FM receiver shown in FIG. 1 is further equipped with an automatic tuning system. More specifically, a scan key (not shown) is provided on a key board 47, and an automatic tuning operation is carried out by operating the scan key. The controller 40 responds to the operation of the scan key and produces a frequency division data which corresponds to a next channel to the present receiving channel. This division data is supplied to the programmable divider 42, so that the local oscillation frequency of the FM (or AM) oscillator 6 (or 15) is changed to receive the next channel. At this time, the controller 40 also produces a muting signal $\phi_2$ which is then supplied to the audio amplifier 31. The amplifier 31 is thereby brought into a muting condition, so that no noise sound is produced by the loudspeaker 32. The muting signal is further supplied to a terminal $T_3$ of the IC, which is connected to a scanning detector 21. The detector 21 detects the application of the muting signal $\phi_2$ and then activates a field strength detector 22.

Since the oscillation frequency of the local oscillator 6 (or 15) is changed to receive the next channel, if an FM (or AM) broadcasting station is present at the received channel, the FM (or AM) IF signal is obtained by the mixer 2 (or 11). However, if the FM (or AM) broadcasting station is not present, the FM (or AM) IF signal is not produced, so that an input voltage supplied to one input end of the detector 22 is smaller than a reference voltage $V_{REF}$ generated from a bias circuit 20. Consequently, an AM/FM switch circuit 23, an FM carrier amplifier 5 and an AM carrier amplifier 14 is maintained in an inactivated state, respectively. There is derived no signal from a carrier output terminal $T_8$. The controller 40 thus recognizes the absence of the broadcasting station and then generates new frequency division data to receive a further next channel.

In the case where the FM (or AM) broadcasting station is present, the IF signal is supplied to the FM (or AM) IF section 3 (or 12). In the FM receiving mode, the IF signals from the respective IF amplifier stages 3-1 to 3-4 are supplied to a rectifier 8 which rectifies those signals and produces a first d.c. level corresponding to the signal level of the FM IF signal. In the AM receiving mode, the AM IF signal is supplied to the AM detector 13 through the AM IF section 12. A buffer amplifier 16 receives the output of the detector 13 and produces a second d.c. level corresponding to the signal level of the AM IF signal.

The AM/FM switching signal $\phi_1$ is also supplied to a switch circuit 50 through a terminal $T_5$ of the IC 100. Therefore, the switch circuit 50 selects the first d.c. level in the FM receiving mode and the second d.c. level in the AM receiving mode. The selected d.c. level is supplied to the field strength detector 22 and compared with the reference voltage $V_{REF}$. If the selected d.c. level is smaller than the reference voltage $V_{REF}$, it can be detected that the broadcasting station is received with a weak electrical field strength and hence the loudspeaker 32 would generate a relatively large noise sound. Therefore, the detector 22 maintains the AM/FM switch circuit 23 in the inactivated state, so that the controller 40 produces new frequency-dividing data to receive a new channel.

When the selected d.c. level exceeds the reference voltage $V_{REF}$, the detector 22 produces an activating signal to the AM/FM switch circuit 23 which also receives the switching signal $\phi_1$. The switching circuit 23 thus responds to the signal $\phi_1$ and activates one of the FM and AM carrier amplifiers 5 and 14. In the FM receiving mode, the FM carrier amplifier 5 is activated and it amplifies the IF carrier signal derived from the third amplifier stage 3—3 in the FM IF section 3. The AM carrier amplifier 14 is activated in the AM receiving mode, and the AM IF carrier signal is amplified. The amplified carrier signal is supplied to a counter 48 through the terminal $T_8$. The counter 48 counts the frequency of the signal supplied from the terminal $T_8$ under the control of the controller 40 by a predetermined period of time. When the receiver is tuned to an FM or AM broadcasting station, the signal supplied to the counter 48 has an FM (or AM) intermediated frequency. However, if the receiver is tuned to the noise signal, the signal to the counter 48 does not take the intermediated frequency.

The count value of the counter 48 is detected by the count-detector 49. When the count value is within a predetermined range, the detector 49 produces a scan stop signal to the controller 40. The controller 40 responds to the scan stop signal and holds the frequency-dividing data to be supplied to the programmable divider 42. As a result, the receiver is tuned to an FM (or AM) broadcasting station having a desired electrical field strength.

The controller 40 further stopps the generation of the muting signal $\phi_2$ to release the audio amplifier 31 from the muting state. The scan detector 21 detects the absence of the muting signal $\phi_2$ and inactivates the field strength detector 22. The switching circuit 23 and the carrier amplifiers 5 and 14 are thereby inactivated.

Figure 2:
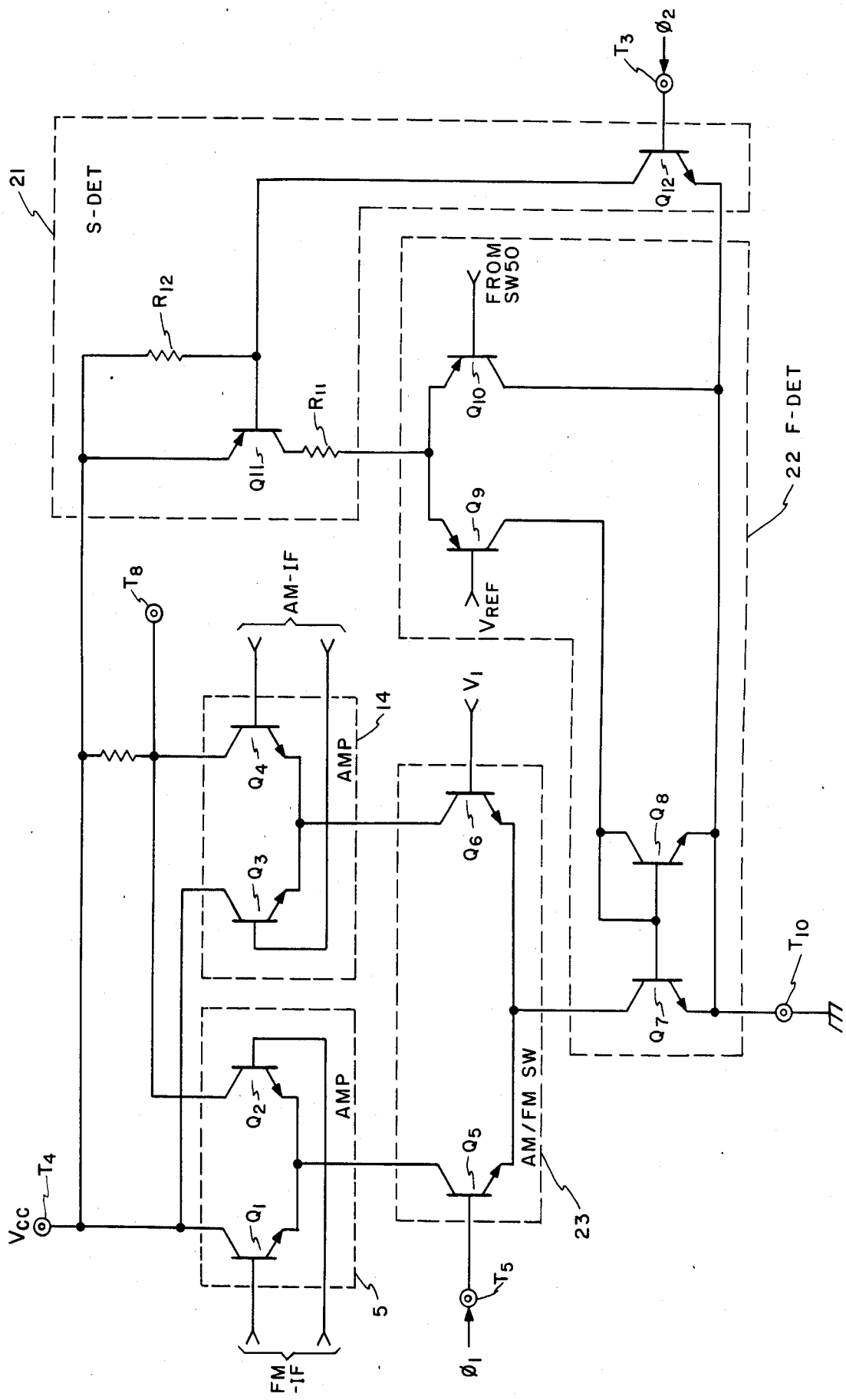
FIG. 2 is a circuit diagram showing a part of the block diagram of FIG. 1.

The scan detector 21, the field strength detector 22, the AM/FM switching circuit 23, and the carrier amplifiers 5 and 14 are constructed as shown in FIG. 2. The detector 21 is composed of a PNP transistor $Q_{11}$, an NPN transistor $Q_{12}$ and two resistors $R_{11}$ and $R_{12}$. The muting signal $\phi_2$ is supplied to the base of the transistor $Q_{12}$. The field strength detector 22 is composed of two PNP transistors $Q_9$ and $Q_{10}$ forming a differential amplifier and two NPN transistors $Q_7$ and $Q_8$ forming a current mirror circuit. The transistor $Q_{11}$ operates as a current source of the transistors $Q_9$ and $Q_{10}$. The reference voltage $V_{REF}$ and the selected d.c. level are supplied to the bases of the transistors $Q_9$ and $Q_{10}$, respectively. The switching circuit 23 is composed of two NPN transistors $Q_5$ and $Q_6$ forming a differential amplifier driven by the transistor $Q_7$. The AM/FM mode switching signal $\phi_1$ is supplied to the base of the transistor $Q_9$. The transistor $Q_{10}$ receives at its base a bias voltage $V_1$ produced from the bias circuit 20 (FIG. 1). The FM carrier amplifier is composed of two NPN transistors $Q_1$ and $Q_2$ constituting a differential amplifier driven by the transistor $Q_5$, and the AM carrier amplifier is composed of two NPN transistor $Q_3$ and $Q_4$ which also form a differential amplifier driven by the transistor $Q_6$. The output ends of the amplifiers 5 and 14 are connected in common to a load resistor $R_{10}$ and further connected to the carrier output terminal $T_8$.

In the automatic tuning operation mode, the muting signal $\phi_2$ takes the high level, so that the transistors $Q_{12}$ and $Q_{11}$ are tuned ON. The detector 22 is thereby activated. When the selected d.c. level supplied from the circuit 50 (FIG. 1) is smaller than the reference voltage $V_{REF}$, the transistors $Q_9$ and $Q_{10}$ are turned OFF and ON, respectively. The transistors $Q_7$ and $Q_8$ are also made nonconducting. The switching circuit 23 and the amplifiers 5 and 14 are in the inactivated state. When the selected d.c. level exceeds the reference voltage $V_{REF}$, the transistors $Q_7$ and $Q_9$ are turned ON to drive the switching circuit 23. In the FM receiving mode, the signal $\phi_1$ has a level higher than the bias voltage $V_1$, so that the transistor $Q_5$ is turned ON. The FM IF carrier signal is thereby amplified by the transistors $Q_1$ and $Q_2$, and the amplified FM carrier signal is produced at the terminal $T_8$. The transistor $Q_6$ is turned ON in the AM receiving mode, so that the AM IF carrier is amplified by the transistors $Q_3$ and $Q_4$.

When the receiver is tuned the FM or AM broadcasting station, the muting signal $\phi_2$ takes the low level. As a result, all the transistors $Q_1$ to $Q_{12}$ are brought into the nonconducting state. Accordingly, no power is consummed in the circuit blocks 21, 22, 23, 5 and 14.

Figure 3:
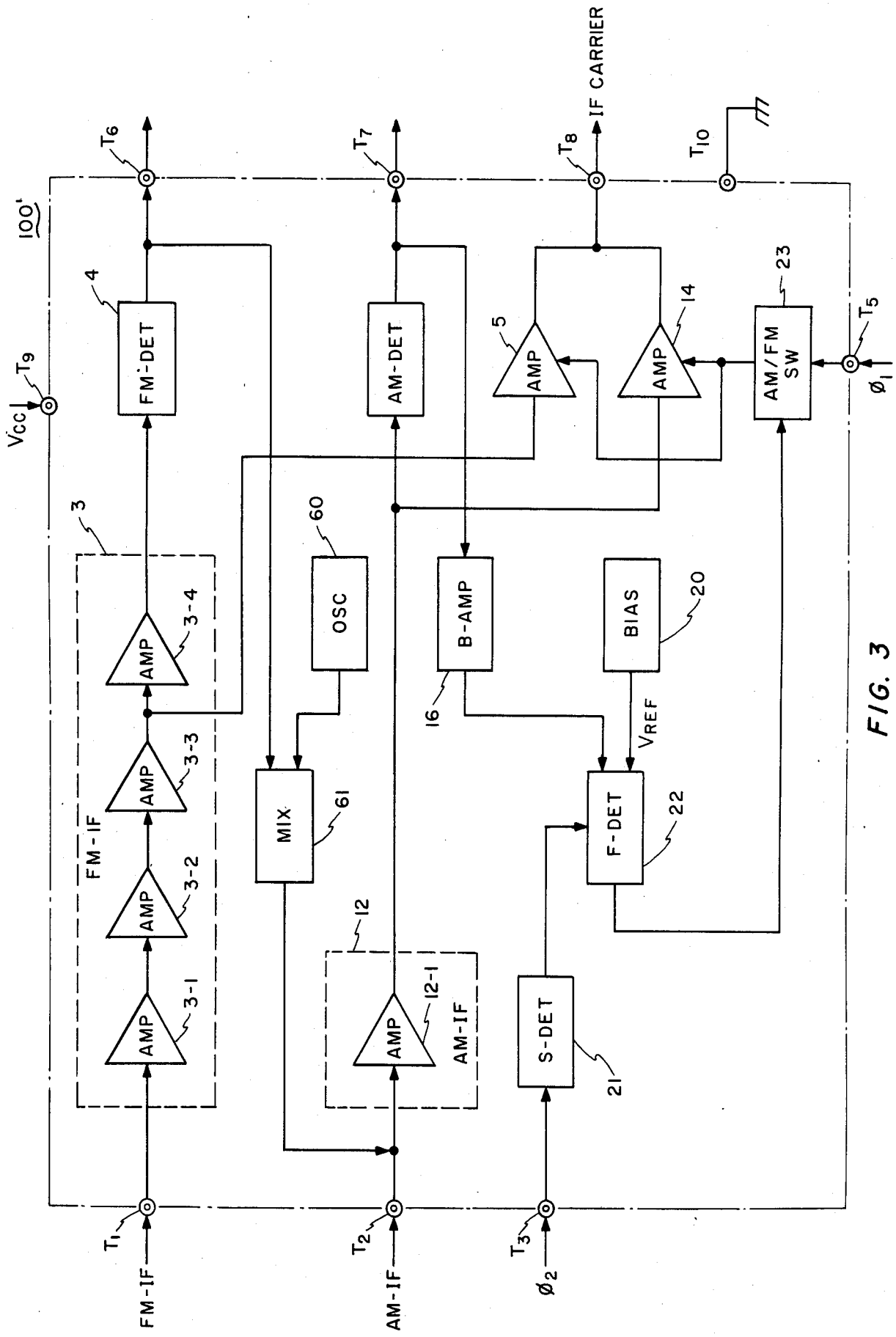
FIG. 3 is a block diagram representing another embodiment of the present invention.

FIG. 3 shows an improved IC 100' in accordance with another embodiment of the present invention, in which the same constituents as those in FIG. 1 are denoted by the same reference numerals to omit their further explanations. In FIG. 1, the electrical field strength of the received FM IF signal is converted into the first d.c. level by the rectifier 8. The rectifier 8 comprises four rectifier sections for four IF amplifier stages 3-1 to 3-4, and therefore its construction is relatively complicated. In addition, the switching circuit 50 is required for selecting one of the first and second d.c. levels.

In order to reduce the circuit elements, the improved IC 100' shown in FIG. 3 detects the electrical field strength of the received FM IF signal by employing the AM detector 13. More specifically, the detected signal produced by the FM detector 4 contains high frequency components above 100 KHz, and further the high frequency components has the signal level dependent on the electrical field strength. The signal having such a high frequency and produced by the FM detector 4 is supplied to one input end of a mixer circuit 61. The other input end of the mixer 61 is supplied with an oscillation signal from an oscillator 60. The mixer thereby converts the high frequency signal derived from the detector 4 into an AM intermediated signal. In the FM receiving operation, the AM IF stage 12 does not receives the received AM IF signal, but receives the frequency-converted signal from the mixer 61. The AM detector 13 thus detects the frequency-converted signal, so that the d.c. level obtained from the buffer amplifier 16 represents the electrical field strength of the received FM broadcasting station. The D.C. level from the amplifier 16 is supplied to the field strength detector 22. As a result, the improved IC 100' does not have the rectifier 8 and the switching circuit 50 (FIG. 1).

A stereo receiver of a PLL type includes a voltage controlled oscillator (VCO) which is controller by a received pilot signal. Accordingly, the oscillation signal supplied to the mixer 61 may be obtained by the VCO.

The present invention is not limited to the abovementioned embodiments, but may be madified and changed without departing from the spirit and scope of the present invention.

What is claimed is:

1. A receiver comprising an AM receiving section including an AM local oscillator and an AM intermediate frequency amplifier, an FM receiving section including an FM local oscillator and an FM intermediate frequency amplifier, means responsive to a receiving mode for changing an oscillation frequency of said AM or FM local oscillator, means responsive to said receiving mode for selecting either one of signals derived from said AM and FM intermediate frequency amplifiers, means for counting a frequency of the signal selected by said selecting means, means responsive to a count value of said counting means for detecting that the frequency of the selected signal is within a predetermined range to produce a detection signal, and means responsive to said detection signal for stopping the change of the oscillation frequency of said AM or FM local oscillator.

2. The receiver as claimed in claim 1, wherein said frequency changing means comprises a phase locked loop circuit including a frequency divider supplied with the oscillation signal from said AM or FM local oscillator, a phase comparator receiving an output signal of said divider and a reference signal, and means responsive to an output of said phase comparator for controlling the local oscillation signal.

3. The receiver as claimed in claim 1, whereas said selecting means comprises a first amplifier supplied with the signal derived from said AM intermediate frequency amplifier, a second amplifier supplied with the signal derived from said FM intermediate frequency amplifier, and means responsive to said receiving mode for activating either one of said first and second amplifiers.

4. In a receiver having a station detector of a type in which a frequency of an intermediate frequency signal is counted by a counter and a station detecting signal which is representative of a presence of a broadcasting station is generated when a count value of said counter is within a predetermined range, a combination comprising: an FM intermediate frequency amplifier stage, an AM intermediate frequency amplifier stage, means for producing a first signal when said station detecting signal is not generated, means responsive to said first signal for producing a second signal representing a receiving mode, means coupled to said FM and AM intermediate frequency amplifier stages for selecting either one of the signals derived from the FM and AM intermediate frequency amplifier stages in response to said second signal, and means for supplying said counter with the selected one of the signals derived from said FM and AM intermediate frequency amplifier stage.

5. In a receiver equipped with an automatic tuning system which comprises frequency scanning means for scanning receiving frequencies, station detector means for detecting whether or not an AM or FM broadcasting signal is present at a receiving frequency and scanning stop means for stopping a scanning operation by said frequency scanning means in response to a detection signal which is representative of a presence of the FM or AM broadcasting signal produced from said station detector means, a combination comprising: an AM intermediate frequency amplifier stage, an FM intermediate frequency amplifier stage, means for producing a first signal for indicating that said scanning operation of said frequency scanning means is carried out, means for producing a second signal representing a field strength of the broadcasting signal, and means for producing a third signal representing that said third signal is larger than a predetermined level, means responsive to said first and third signals for producing a fourth signal which indicates a receiving mode, and means coupled to said AM and FM intermediated frequency amplifier stages for selecting one of the signals derived therefrom in response to said fourth signal and for supplying the selected signal to said station, detector means, said station detector means producing said detection signal when a frequency of said selected signal is within a predetermined range.

6. The combination as claimed in claim 5, wherein said second signal producing means comprises means coupled to said FM intermediate frequency amplifier stage for converting said FM intermediate frequency signal into a first d.c. signal, means coupled to said AM intermediate frequency amplifier stage for converting said AM intermediate frequency signal into a second d.c. signal, and means responsive to said receiving mode for selecting either one of said first and second d.c. signals.

7. The combination as claimed in claim 5, further comprising an FM detector coupled to said FM intermediate frequency amplifier state, and an AM detector coupled to said AM intermediate frequency amplifier, said second signal producing means comprising frequency-converting means for converting a signal contained in an output signal of said FM detector into a fifth signal having an approximate AM intermediate frequency, means for supplying said fifth signal to said AM intermediate frequency amplifier stage, and means responsive to an output signal of said AM detector for producing said second signal.

8. A circuit for an AM/FM receiver, comprising an output terminal from which a signal is derived to detect the presence of a signal from a broadcasting station, an AM intermediate frequency stage for amplifying an AM intermediate frequency signal, an FM intermediate frequency stage for amplifying an FM intermediate frequency signal, means for producing a first signal representing an electrical field strength of said broadcasting station, means responsive to said first signal for generating a second signal when said electrical field strength of said broadcasting station exceeds a predetermined value, a switching terminal supplied with a mode switching signal representing a receiving mode of said receiver, means coupled to said AM and FM intermediate frequency stages for selecting either one of said AM and FM intermediate frequency signals in response to said second signal and said mode switching signal, and means for supplying the selected intermediate frequency signal to the output terminal.

9. The circuit as claimed in claim 8, wherein said supplying means comprises a first amplifier coupled between said AM intermediate frequency stage and said output terminal, a second amplifier coupled between said FM intermediate frequency stage and said output terminal, and a switching circuit responding to said second signal and said mode switching signal and activating either one of said first and second amplifiers.

* * * * *